(12) United States Patent
Becker et al.

(10) Patent No.: US 9,318,421 B2
(45) Date of Patent: Apr. 19, 2016

(54) POWER SEMICONDUCTOR CHIP WITH A METALLIC MOULDED BODY FOR CONTACTING THICK WIRES OR STRIPS AND METHOD FOR THE PRODUCTION THEREOF

(75) Inventors: Martin Becker, Kiel (DE); Ronald Eisele, Surendorf (DE); Frank Osterwald, Kiel (DE); Jacek Rudzki, Kiel (DE)

(73) Assignee: Danfoss Silicon Power GmbH, Flensburg (DE)

( * ) Notice: Subject to any disclaimer, the term of this patent is extended or adjusted under 35 U.S.C. 154(b) by 0 days.

(21) Appl. No.: 14/346,458

(22) PCT Filed: Sep. 10, 2012

(86) PCT No.: PCT/EP2012/003787
§ 371 (c)(1),
(2), (4) Date: Mar. 21, 2014

(87) PCT Pub. No.: WO2013/053420
PCT Pub. Date: Apr. 18, 2013

(65) Prior Publication Data
US 2014/0225247 A1    Aug. 14, 2014

(30) Foreign Application Priority Data
Oct. 15, 2011   (DE) .......................... 10 2011 115 887

(51) Int. Cl.
*H01L 23/48* (2006.01)
*H01L 23/52* (2006.01)
(Continued)

(52) U.S. Cl.
CPC ............ *H01L 23/4924* (2013.01); *H01L 24/05* (2013.01); *H01L 24/48* (2013.01);
(Continued)

(58) Field of Classification Search
CPC ............. H01L 2224/4911; H01L 2224/32245; H01L 24/48
USPC .......... 257/748, 750, 762, 784, 736, E33.066, 257/E23.024, E21.509; 438/612, 613, 666
See application file for complete search history.

(56) References Cited

U.S. PATENT DOCUMENTS

| 5,300,458 A | 4/1994 | Kuhnert et al. |
| 5,510,650 A | 4/1996 | Erskine, Jr. |

(Continued)

FOREIGN PATENT DOCUMENTS

| CN | 101339934 A | 1/2009 |
| DE | 19612838 A1 | 5/1997 |

(Continued)

OTHER PUBLICATIONS

International Search Report for PCT Application PCT/EP2012/003786 dated Dec. 21, 2012.
(Continued)

*Primary Examiner* — Nitin Parekh
(74) *Attorney, Agent, or Firm* — McCormick, Paulding & Huber LLP

(57) ABSTRACT

The invention relates to a power semiconductor chip (10) having at least one upper-sided potential surface and contacting thick wires (50) or strips, comprising a connecting layer (I) on the potential surfaces, and at least one metal molded body (24, 25) on the connecting layer(s), the lower flat side thereof facing the potential surface being provided with a coating to be applied to the connecting layer (I) according to a connection method, and the material composition thereof and the thickness of the related thick wires (50) or strips arranged on the upper side of the molded body used according to the method for contacting are selected corresponding to the magnitude.

18 Claims, 2 Drawing Sheets

(51) Int. Cl.
*H01L 23/492* (2006.01)
*H01L 23/00* (2006.01)

(52) U.S. Cl.
CPC ............... *H01L 24/49* (2013.01); *H01L 24/45* (2013.01); *H01L 2224/0311* (2013.01); *H01L 2224/03013* (2013.01); *H01L 2224/04042* (2013.01); *H01L 2224/0603* (2013.01); *H01L 2224/2908* (2013.01); *H01L 2224/32225* (2013.01); *H01L 2224/45014* (2013.01); *H01L 2224/45015* (2013.01); *H01L 2224/45124* (2013.01); *H01L 2224/45139* (2013.01); *H01L 2224/45147* (2013.01); *H01L 2224/48227* (2013.01); *H01L 2224/48472* (2013.01); *H01L 2224/48491* (2013.01); *H01L 2224/49111* (2013.01); *H01L 2224/73265* (2013.01); *H01L 2224/786* (2013.01); *H01L 2224/8382* (2013.01); *H01L 2224/8384* (2013.01); *H01L 2224/83801* (2013.01); *H01L 2924/00015* (2013.01); *H01L 2924/01013* (2013.01); *H01L 2924/01014* (2013.01); *H01L 2924/01015* (2013.01); *H01L 2924/01028* (2013.01); *H01L 2924/01029* (2013.01); *H01L 2924/01047* (2013.01); *H01L 2924/10253* (2013.01); *H01L 2924/1203* (2013.01); *H01L 2924/181* (2013.01)

(56) References Cited

U.S. PATENT DOCUMENTS

| | | | |
|---|---|---|---|
| 5,986,338 A | 11/1999 | Nakajima | |
| 6,055,148 A * | 4/2000 | Grover | 361/103 |
| 6,137,159 A * | 10/2000 | Tsubosaki et al. | 257/666 |
| 7,498,671 B2 * | 3/2009 | Fujiwara | H01L 23/3735 257/690 |
| 2005/0276934 A1 | 12/2005 | Fukui et al. | |
| 2007/0018338 A1 * | 1/2007 | Hosseini | H01L 23/488 257/784 |
| 2007/0246833 A1 | 10/2007 | Soga et al. | |
| 2007/0278550 A1 | 12/2007 | Asai et al. | |
| 2007/0284722 A1 * | 12/2007 | Standing | B23K 35/0244 257/690 |
| 2008/0246130 A1 | 10/2008 | Carney et al. | |
| 2009/0008775 A1 * | 1/2009 | Tanaka et al. | 257/737 |
| 2010/0207263 A1 * | 8/2010 | Nikitin et al. | 257/690 |
| 2011/0075451 A1 | 3/2011 | Bayerer et al. | |
| 2011/0079792 A1 * | 4/2011 | Lostetter et al. | 257/77 |
| 2014/0230989 A1 | 8/2014 | Becker et al. | |

FOREIGN PATENT DOCUMENTS

| | | |
|---|---|---|
| DE | 102004036905 A1 | 3/2006 |
| DE | 102005047566 A1 | 4/2007 |
| DE | 102005054872 B4 | 4/2012 |
| EP | 0 520 294 A1 | 12/1992 |
| EP | 1 772 900 A2 | 4/2007 |
| EP | 1772900 A2 | 4/2007 |
| JP | 56-101752 A | 8/1981 |
| JP | 2003229527 A | 8/2003 |
| JP | 2008-16818 A | 1/2008 |
| WO | 2006012847 A1 | 2/2006 |

OTHER PUBLICATIONS

International Search Report for PCT Serial No. PCT/EP2012/003787 dated Dec. 20, 2012.
Danish Office Action for Application Serial No. 102011115887.5 dated Nov. 25, 2011.
Danish Office Action for Application Serial No. 102011115887.5 dated Dec. 11, 2013.

* cited by examiner

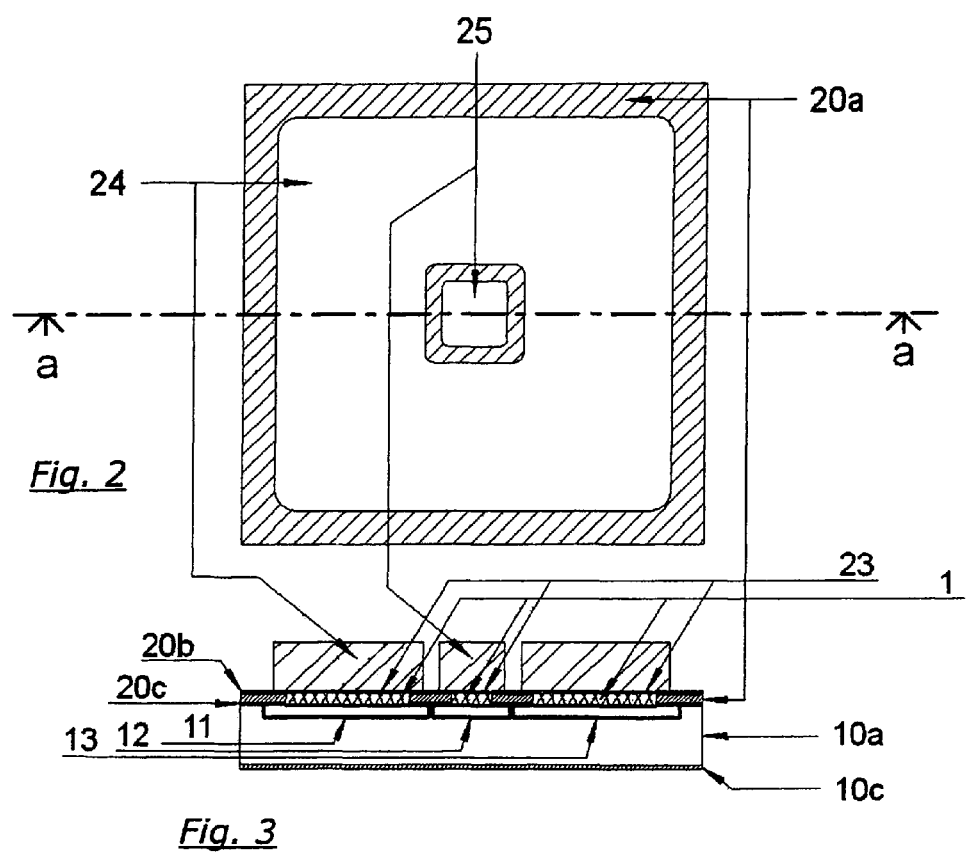

POWER SEMICONDUCTOR CHIP WITH A METALLIC MOULDED BODY FOR CONTACTING THICK WIRES OR STRIPS AND METHOD FOR THE PRODUCTION THEREOF

CROSS REFERENCE TO RELATED APPLICATIONS

This application is entitled to the benefit of and incorporates by reference subject matter disclosed in International Patent Application No. PCT/EP2012/003787 filed on Sep. 10, 2012 and German Patent Application No. 10 2011 115 887.5 filed Oct. 15, 2011.

FIELD OF THE INVENTION

The invention concerns a power semiconductor chip with at least one upper side potential face. Power modules usually comprise several semiconductors, for example diodes, with load current flowing through many of these semiconductors laterally to the chip face.

BACKGROUND

In order to develop long-lived and robust modules, especially the upper and lower connections of the semiconductor (upper side and lower side) have high thermal and electrical requirements. Usually, the lower side of the semiconductor is connected by a soldered connection or partly also by a sintered or diffusion soldered connection.

Normally, the upper side of the semiconductor comprises a metallisation or a metal layer that is optimised for the bonding process of thick aluminium wires. In spite of such highly deformable metallisation layers on the upper and lower side of the semiconductor, the semiconductors continue to become thinner in order to reduce the electrical losses. Currently, power semiconductors on the market have a total thickness of 70 μm. Research institutes have already presented the first wafers with the extreme thickness of only 10 μm.

The upper side chip connection has a very large influence on the limitation of the life duration of a power module. A very robust sintered connection on the lower side of a chip only causes a slight increase in the module life duration, as the failure of the aluminium wires on the upper side of the semiconductor is the limiting factor.

For many years, the Al-bonding has been an established technology in the production lines for power electronics. A continuous optimisation of the bonding processes has caused an increase in the expected life duration of this connection. However, this high level is approximately at the physical limit of the stressability of an aluminium weld connection, so that large steps in the life duration expectation can only be realised by new concepts in the design and bonding technique. This requirement is also supported by the fact that already now the sintering technology (compared with the soldering technology) on the lower side of the semiconductor contributes to a two-figure increase in the factor of the life duration expectation.

Further, during the process difficulties occur in the handling of the 70 μm thin semiconductors (and those difficulties are expected to increase heavily with even thinner semiconductors!) Thus, both for the parameterisation of the production and test processes and for the configuration of the concepts, the very thin silicon layer is an increasing profit risk in the production. The risk of fracture exists not only due to thermo mechanical stress, but also due to light loads during the production processes (for example mounting of the contact needle for high current tests at wafer level).

SUMMARY

It is now the object of the invention to improve the life duration of a power module, in particular of the power semiconductor chip, by improving the contacts on the upper side potential face(s). At the same time, the profit is to be increased by a design which is more stable and involves less risk of fracture.

According to the invention, this is solved by the features of the main claim. The sub claims refer to advantageous embodiments. In order to realise the change to this new technology for the upper side connection, required modifications will initially be described for the design of the power module.

These modifications enable the change of the upper side contacting to the thick-wire copper bonding technology, which provides a drastic increase in the load cycle endurance. Further, the modifications also provide a reduction of the risk of fractures caused by the thermo mechanical stresses of the semiconductors and the mechanical stresses from the production process.

This is caused by locating metallic layers or moulded bodies at least above and preferably also below the semiconductor so that the semiconductor is thermo mechanically stressed in a symmetric manner.

Further, the thin layers or moulded bodies form a mechanical protection of the surfaces, in particular across the potential faces, for example by frictional contacting test processes (high current tests at wafer level). This permits a safe electrical test of the semiconductor before completing the upper side connection of the semiconductor. For the electrical test, the surface of the metallic layer that is bonded to the semiconductor is contacted by special spring tools without risking damage to the fine surface structures of the semiconductor.

BRIEF DESCRIPTION OF THE DRAWINGS

Further advantages and features of the invention appear from the following description of a preferred embodiment on the basis of the enclosed figures, showing.

DETAILED DESCRIPTION

Figure 1:
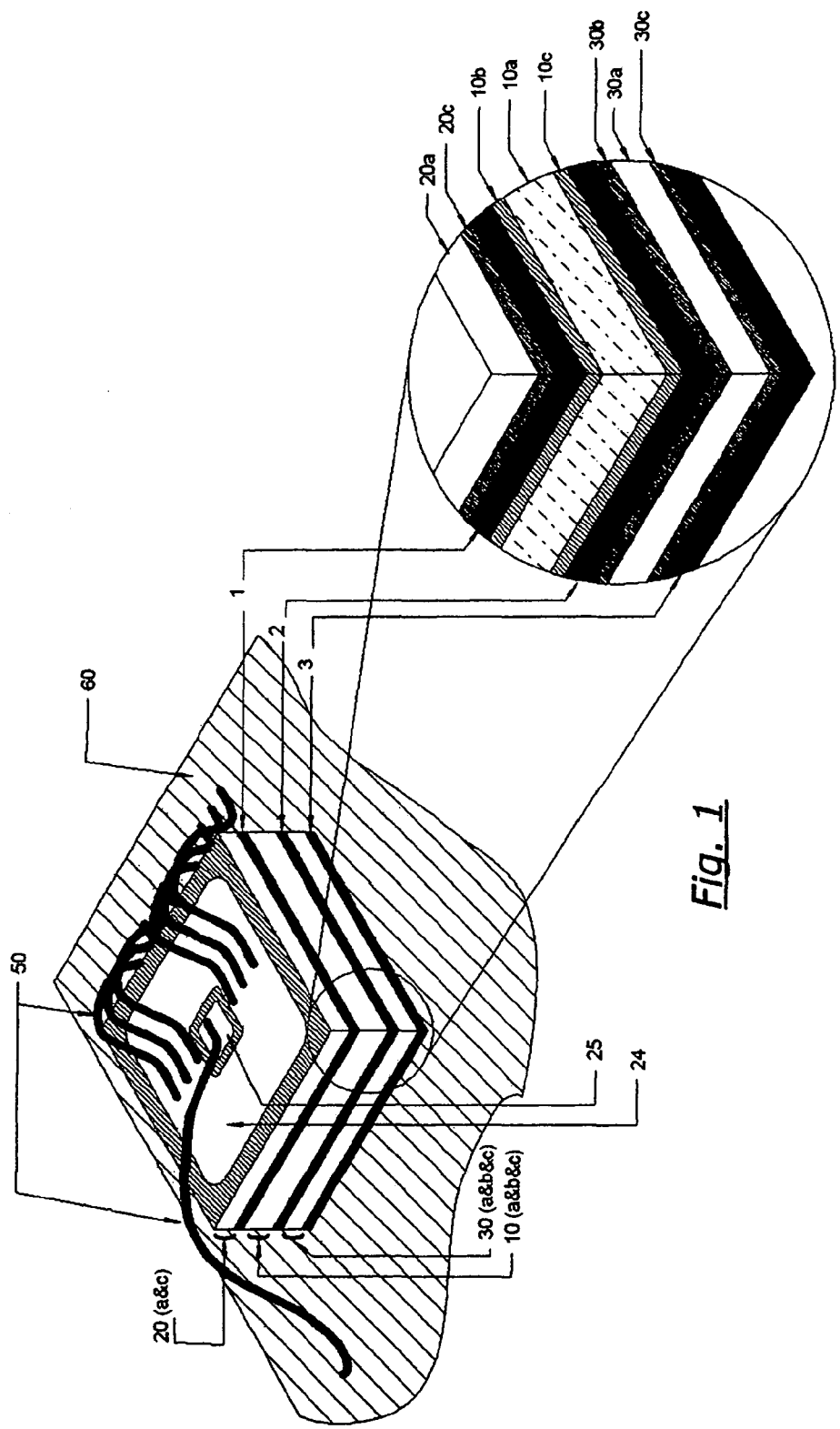
FIG. 1 schematic, perspective complete and detail views of a power semiconductor chip with upper connection according to the invention, FIG. 2 a top view of the moulded body held on a carrier layer, and FIG. 3 a schematic view along a section in the line from a to a in FIG. 2.

The power semiconductor chip 10 according to the invention, with upper side potential faces, preferably comprises at least one electrically conductive moulded body 24, 25 that covers a potential face. In FIG. 2, the moulded body 24 is shown as an annular layer that surrounds a further moulded body 25. Several potential faces can be placed under the layer to be joined with the layer, for example four faces in the corner areas, or two oppositely arranged faces as shown in the sectional view. Also the case that the potential face of the power semiconductor chip 10 has approximately the annular shape of the layer is not excluded.

On the upper side, the power semiconductor chip 10 has potential faces, on which the moulded bodies are fixed, preferably in an electrically and thermally well conducting manner (by means of Cu, Ag, Au Al, Mo, W and their alloys). The moulded bodies will have thicknesses of approximately 30 μm to 300 μm. For thin semiconductors in the range around 30 μm, moulded bodies in the range between 30 μm and 40 μm will be suitable, and for thicker semiconductor chips in the range from 150 μm to 200 μm, somewhat thicker moulded bodies in the range from 100 μm to 150 μm will be suitable.

Such a moulded body is fixed on the metallisation layer 10*b* of the semiconductor by means of a bonding layer 1 in the low-temperature sintering technology (or diffusion welding or gluing). In this connection, the moulded body does not extend the dimensions of the power semiconductor chip 10.

Optionally, in a preferred embodiment, an additional moulded body 30 can be fixed on the bottom side of the power semiconductor chip 10. It has the same layer thickness as the moulded body 24, 25 on the upper side of the power semiconductor chip 10. The bond 2 between the moulded body 30 on the bottom side and the power semiconductor chip 10 is the same as the bonding technology between the chip and the moulded body 24, 25 on the upper side.

In this connection, power semiconductor chips having several electrically different potential faces on their surface, can receive a number of moulded bodies 24, 25 that corresponds to the number of different potentials. Each potential face of the semiconductor (for example emitter and gate) will be joined electrically with the bottom side of the moulded body via a joint.

If, however, one electrical potential of the semiconductor appears on several surfaces (for example emitter faces segmented by gate fingers), it is an option that a corresponding number of individual moulded bodies is also provided.

As the moulded body can partly also form individual islands 25 (variant 1 and 2), it is advantageous to use a carrying material 20*a* that ensures bonding of the small plate during assembly.

This carrying material could be a temperature-resistant synthetic material, for example polyamide or polyimide that is resistant to high temperatures as well as an insulator to prevent a current flow between the various potential faces 24, 25. The individual moulded bodies on the potential faces 24, 25 consist of, for example, a thin copper plate (30 μm to 300 μm) that is covered on the side facing the chip by an oxidation-inhibiting protection layer 23 (Ag or Au). The carrying material 20*a* and the moulded body 24, 25 form a common carrying foil with structured conducting faces, i.e., for example, the annular conductive faces made by etching as shown in FIG. 2.

The upper side carrying foil 20*a* can also comprise several moulded body faces simultaneously covering the upper side potential faces with the same potential, or moulded bodies that reflect the electrical contact faces 11, 12 of the semiconductor and are firmly sintered onto them in an accurately fitting manner.

Electrically, these moulded bodies are preferably connected by metallic conductors in the form of wires, strips, wire bundles, woven or fibrous belts 50 on the upper side of the individual moulded body 24, 25. In this connection, a preferred embodiment is copper thick-wire bonds (for example up to 600 μm diameter).

In FIG. 3 it can be seen, how metallic moulded bodies 24, 25 are arranged above the chip potential faces 11, 12, 13. Also under the chip 10 the side of a moulded body facing the chip and comprising a carrying foil can be joined with the full face of the bottom side of the semiconductor. For this bond, the upper face of the small plate can comprise an oxidation-inhibiting layer. By means of the sintering or diffusion soldering technique, a material bond with the metallisation layer 10*c* on the bottom side of the semiconductor will finally be realised.

On the bottom side of the semiconductor, the moulded body can further have a layer thickness that generates a balanced mechanical stress in combination with the moulded bodies on the upper side of the chip. This means that joining the bottom side plates and upper side moulded bodies will only result in a very small deformation of the semiconductor.

A preferred solution is to make both layers with the same thickness and of the same material. This is either pure copper that covers the whole face up to the edges or a large, framed copper island having a circumferentially extending, very narrow (a few 100 μm) polyamide foil as can be seen from FIG. 2.

However, it is also possible to balance the expansion properties of a certain material with a given thermal expansion coefficient and elasticity module by arranging a different material with other properties. For example, an upper side, relatively thick copper layer can be compensated by a thin bottom side layer of molybdenum.

The technology (sintering, diffusion soldering, gluing) of the bond 3 (FIG. 1) between the bottom side moulded bodies and the substrate surface corresponds to those being used in connection with the other bonding layers mentioned.

By means of multiple joining, the upper side contact foil can contact all semiconductor elements of an unsawn wafer assembly. Thus, a particularly low-tolerance overlapping of all conductor faces of the contact foil with the potential faces of the semiconductor is achieved. A cost-efficient equivalent method occurs in relation to the serial assembly of a semiconductor element and a single-contact foil. After joining the wafer contact foil with the semiconductor wafer by means of low-temperature sintering, soldering or gluing, a conventional separation, for example by sawing, is possible.

A comparable process is possible with a wafer contact foil for the bottom side of the semiconductor element in the wafer bond. Thus, after upper side and bottom side foil contacting, the usual separation, for example sawing, can be used to produce the individual semiconductor elements with double-sided coating.

The advantages of using the power semiconductor chip with at least one upper side potential face and connecting thick wires or strips, with a bonding layer on the potential faces, and at least one metallic moulded body on the bonding layer(s), the lower flat side of said body facing the potential face being coated appropriately for the bonding process of the bonding layer, and the material composition and thickness of said body being chosen in accordance with the dimensions of the thick wires or strips used in the connecting process on the upper side of the moulded body, are as follows:

- The moulded bodies enable an upper side connection by means of thick copper wires, including for thin semiconductor elements.
- The moulded bodies protect the sensitive, thin metallised surfaces of the semiconductors (typically only around 3 μm to 4 μm) during the copper thick wire bonding.
- The moulded bodies ensure an improved current density distribution over the whole cross-section of the chip surface.
- The moulded bodies protect the sensitive surface structure of the semiconductor during the frictional contacting by means of sprung contacts. This simplifies the non-destructive, electrical quality testing in the production lines.

By means of symmetrisation of the mechanical stresses, a bottom-side foil and moulded body layer prevents the dishing effect (deformation of the semiconductor element).

Upper side and bottom side carrying foils carry moulded body areas that can cover a complete wafer, thus enabling a parallel provision of all contact faces with moulded bodies in a cost-effective and accurate manner.

FIG. 1 shows the power semiconductor chip 10 according to the invention, upper side potential faces 11, 12, 13 (see FIG. 3) being connected electrically and materially by only two moulded bodies 24, 25 via a bonding layer 1. The potential faces 11 and 13 have the same potential and can therefore be connected in common by an electrically conducting, circumferential conducting face of the moulded body 24 as shown in FIG. 2 as approximately square with a central recess. With an embodiment as in FIG. 2, further faces to be connected are possible below the complete upper side extension of the moulded component. After applying a bonding layer 1, the moulded body 24 would then also be bonded there.

A separate moulded body 25 is provided on a potential face 12 with a different potential, for example a gate. Both moulded bodies 24, 25 are held on a contact foil 20a having passages at its bottom side in the area of the moulded bodies 24, 25.

The moulded component(s) 24, 25 are made of a metal to be good electrical and thermal conductors, for example the moulded body 24, 25 comprises a material of the group Cu, Ag, Au, Al, Mo, W or their alloys, the alloys comprising either one or more metals of the group mentioned.

The moulded bodies 24, 25 will have a thickness between 15 μm and 500 μm, preferably 30 μm and 300 μm. Advantageous is a thickness between 75 μm and 150 μm. For thin semiconductors (in the range of 30 μm) moulded bodies between 30 and 40 μm and for thicker semiconductor chips of 150 μm to 200 μm moulded bodies between 100 μm and 150 μm will be appropriate. In the case of thick wire bonding, a thickness corresponding to one fourth of the wire diameter is sufficient for the body to fulfil its stabilising function. Accordingly, moulded body thicknesses from one fourth to half the wire diameter are proposed.

Like the upper side component, the additional moulded body 30 provided on the bottom side of the power semiconductor chip 10 next to the upper side moulded body 24, 25, is also mounted on the power semiconductor chip 10 by means of low-temperature sintering technology, diffusion soldering or gluing.

Corresponding to the number of upper side potential faces 11, 13; 12 provided with different potentials, the same or a larger number of moulded bodies 24, 25 can be used. In the ideal case, one moulded body can be used for all potential faces with the same potential, or locally matching, smaller partial numbers of potential faces are contacted and joined with one common moulded body 24, 25.

The simplest variant uses one moulded body per potential face, the dimensions of the moulded bodies then being strictly adapted to the dimensions of the potential faces. It is advantageous, if the connection to be made under each moulded body 24, 25 has a smaller projection face than the moulded body 24, 25, so that a rim of the moulded body remains to be fixed on an organic non-conducting carrying foil 20a, which again can be fixed on the power semiconductor chip 10 after accurate fitting.

In this connection, the carrying foil 20a can cover the non-bonding areas of the chip surface in an adhesive manner. However, it should not extend over the outer edges of the chip.

FIG. 3 shows the case in which the dimensions of the bonding layer 1 of sintering material are slightly smaller than those of both moulded body and potential face, and the carrying foil 20a still extends over the rim areas of the potential faces. This can relieve the rim areas during joining. A further variant leaves some potential faces, for example control connections, free of moulded bodies for direct contacting of those connections.

Finally, the thermal expansion properties of an upper side moulded body 24, 25 can be compensated by selecting a different material or a different thickness of an additional moulded body 30 on the bottom side of the power semiconductor chip 10 to achieve little resulting total expansion. In this connection, the moulded body should not reach the edge of the power semiconductor chip. This would make expensive insulation necessary.

A proposed method of applying moulded bodies on a power semiconductor chip uses an electrically insulating, carrying sheet 20a that can resist the thermal load during bonding and comprises a number of moulded bodies 24, 25. These are then applied simultaneously on the power semiconductor chip before joining, meaning that also a number of moulded bodies 24, 25 can be used for a plurality of power semiconductor chips 10 for low-tolerance overlapping of the upper side, and—with an additional carrying sheet or an electrically conducting foil—also the lower side.

Although various embodiments of the present invention have been described and shown, the invention is not restricted thereto, but may also be embodied in other ways within the scope of the subject-matter defined in the following claims.

| Reference numbers | |
|---|---|
| 1: | Bonding layer (low temperature joining or diffusion soldering) |
| 2: | Bonding layer (low temperature joining or diffusion soldering) |
| 3: | Bonding layer (low temperature joining or diffusion soldering) |
| 10: | Chip |
| 10a: | Silicon |
| 10b: | Upper side chip metallisation |
| 10c: | Lower side chip metallisation |
| 24, 25: | Moulded bodies on the upper side of the semiconductor (contact foil with several conducting faces) |
| 20a: | Carrying foil of, for example, polyamide |
| 20b: | Adhesive between moulded body and carrying foil |
| 20c: | Adhesive between carrying foil and upper chip side |
| 23: | Lower side oxidation inhibiting layer of the conducting copper faces |
| 24: | First conducting copper face (for example emitter) |
| 25: | Second conducting copper face (for example gate) |
| 30: | Moulded body under the semiconductor |
| 30a: | Polyamide |
| 30b: | Adhesive |
| 30c: | Adhesive |
| 34a: | Copper island of thin copper sheet |
| 34b: | Copper sheet |
| 36: | Lower side oxidation inhibiting layer of the copper Island/the copper sheet |
| 37: | Upper side oxidation inhibiting layer of the copper Island/the copper sheet |
| 50: | Copper wires |
| 60: | Substrate surface |

What is claimed is:

1. A power semiconductor chip comprising:
an upper bonding layer disposed on a potential face on an upper side of the power semiconductor chip,
at least one upper metallic moulded body disposed on the upper bonding layer, a lower flat side of the at least one upper metallic moulded body facing the potential face and being coated to bond to the upper bonding layer, and thick wires or strips connected to an upper side of the at least one upper metallic moulded body, wherein a surface area of the upper bonding layer for bonding to the lower flat side of the at least one upper metallic moulded body in a plan view is smaller than the lower flat side of the at least one upper metallic moulded body such that a rim of the at least one upper metallic moulded body is fixed on an organic, non-conducting carrying foil.

2. The power semiconductor chip according to claim 1, wherein the at least one upper metallic moulded body comprises at least one of Cu, Ag, Au, Al, Mo, W or alloys comprising one or more of Cu, Ag, Au, Al, Mo or W, and the lower flat side of the at least one upper metallic moulded body being covered by at least one of Ag or Au.

3. The power semiconductor chip according to claim 2, wherein a surface area of the upper bonding layer for bonding to the lower flat side of the at least one upper metallic moulded body is smaller than the lower flat side of the at least one upper metallic moulded body such that a rim of the at least one upper metallic moulded body fixed on the organic, non-conducting carrying foil.

4. The power semiconductor chip according to claim 2, wherein a carrying foil adheringly covers areas of a metalissation surface of the upper side of the power semiconductor chip that are not to be bonded to the at least one upper metallic moulded body.

5. The power semiconductor chip according to claim 2, wherein the carrying foil does not extend over an outer rim of the power semiconductor chip.

6. The power semiconductor chip according to claim 2, wherein a lower metallic moulded body is disposed on a bottom side of the power semiconductor chip, the lower metallic moulded body being fitted by means of a lower bonding layer for bonding by means of low-temperature sintering, diffusion soldering or gluing.

7. The power semiconductor chip according to claim 2,
wherein the upper side of the power semiconductor chip has more than one potential face, each potential face having a different potential, and
wherein the number of the at least one upper metallic moulded body corresponds to the number of the more than one potential face.

8. The power semiconductor chip according to claim 1, wherein a carrying foil adheringly covers areas of a metalissation surface on the upper side of the power semiconductor chip that are not to be bonded to the to the lower flat side of the at least one upper metallic moulded body.

9. The power semiconductor chip according to claim 8, wherein the carrying foil does not extend over an outer rim of the power semiconductor chip.

10. The power semiconductor chip according to claim 8, wherein a lower metallic moulded body is disposed on a bottom side of the power semiconductor chip, the lower metallic moulded body being fitted by means of a lower bonding layer for bonding by means of low-temperature sintering, diffusion soldering or gluing.

11. The power semiconductor chip according to claim 1, wherein the carrying foil does not extend over an outer rim of the power semiconductor chip.

12. The power semiconductor chip according to claim 11, wherein a lower metallic moulded body is on the bottom side of the power semiconductor chip, the lower metallic moulded body being fitted by means of a lower bonding layer for bonding by means of low-temperature sintering, diffusion soldering or gluing.

13. The power semiconductor chip according to claim 1, wherein a lower metallic moulded body is disposed on a bottom side of the power semiconductor chip, the lower metallic moulded body being fitted by means of a lower bonding layer for bonding by means of low-temperature sintering, diffusion soldering or gluing.

14. The power semiconductor chip according to claim 1,
wherein the upper side of the power semiconductor chip has more than one potential face, each potential face having a different potential, and
wherein the number of the at least one upper metallic moulded body corresponds to the number of the more than one potential face.

15. The power semiconductor chip according to claim 1, wherein the carrying foil adheringly covers areas of a metalissation surface of the upper side of the power semiconductor chip that are not to be bonded to the at least one upper metallic moulded body.

16. The power semiconductor chip according to claim 1, wherein the carrying foil does not extend over an outer rim of the power semiconductor chip.

17. The power semiconductor chip according to claim 1, wherein a lower metallic moulded body is disposed on a bottom side of the power semiconductor chip, the lower metallic moulded body being fitted by means of a lower bonding layer for bonding by means of low-temperature sintering, diffusion soldering or gluing.

18. The power semiconductor chip according to claim 1,
wherein the upper side of the power semiconductor chip has more than one potential face, each potential face having a different potential, and
wherein the number of the at least one upper metallic moulded body corresponds to the number of the more than one potential face.

* * * * *